(12) United States Patent
Hsieh et al.

(10) Patent No.: US 9,502,343 B1
(45) Date of Patent: Nov. 22, 2016

(54) DUMMY METAL WITH ZIGZAGGED EDGES

(71) Applicant: Taiwan Semiconductor Manufacturing Company, Ltd., Hsin-Chu (TW)

(72) Inventors: Cheng-Hsien Hsieh, Hsin-Chu (TW); Hsien-Wei Chen, Hsin-Chu (TW); Chi-Hsi Wu, Hsin-Chu (TW); Chen-Hua Yu, Hsin-Chu (TW); Der-Chyang Yeh, Hsin-Chu (TW); Li-Han Hsu, Hsin-Chu (TW); Wei-Cheng Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/858,558

(22) Filed: Sep. 18, 2015

(51) Int. Cl.
*H01L 23/52* (2006.01)
*H01L 23/498* (2006.01)
*H01L 23/31* (2006.01)

(52) U.S. Cl.
CPC ..... *H01L 23/49838* (2013.01); *H01L 23/3171* (2013.01); *H01L 23/498* (2013.01); *H01L 23/49827* (2013.01)

(58) Field of Classification Search
CPC .... H01L 23/522; H01L 23/538; H01L 24/19
See application file for complete search history.

(56) References Cited

U.S. PATENT DOCUMENTS

| | | |
|---|---|---|
| 2005/0280120 A1* | 12/2005 | Tomita .......... H01L 23/522 257/620 |
| 2011/0241202 A1 | 10/2011 | Liu et al. |
| 2013/0026618 A1 | 1/2013 | Chen |
| 2015/0170995 A1 | 6/2015 | Chen et al. |

* cited by examiner

*Primary Examiner* — Elias M Ullah
(74) *Attorney, Agent, or Firm* — Slater Matsil, LLP

(57) ABSTRACT

A structure includes a metal pad, a passivation layer having a portion covering edge portions of the metal pad, and a dummy metal plate over the passivation layer. The dummy metal plate has a plurality of through-openings therein. The dummy metal plate has a zigzagged edge. A dielectric layer has a first portion overlying the dummy metal plate, second portions filling the first plurality of through-openings, and a third portion contacting the first zigzagged edge.

20 Claims, 9 Drawing Sheets

DUMMY METAL WITH ZIGZAGGED EDGES

BACKGROUND

In the formation of integrated circuits, devices such as transistors are formed at the surface of a semiconductor substrate in a wafer. An interconnect structure is then formed over the integrated circuit devices. A metal pad is formed over, and is electrically coupled to, the interconnect structure. A passivation layer and a first polymer layer are formed over the metal pad, with the metal pad exposed through the openings in the passivation layer and the first polymer layer.

Post-passivation interconnect (PPI) is then formed, followed by the formation of a second polymer layer over the PPI. An Under-Bump-Metallurgy (UBM) is formed extending into an opening in the second polymer layer, wherein the UBM is electrically connected to the PPI. A solder ball is then placed over the UBM and reflowed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
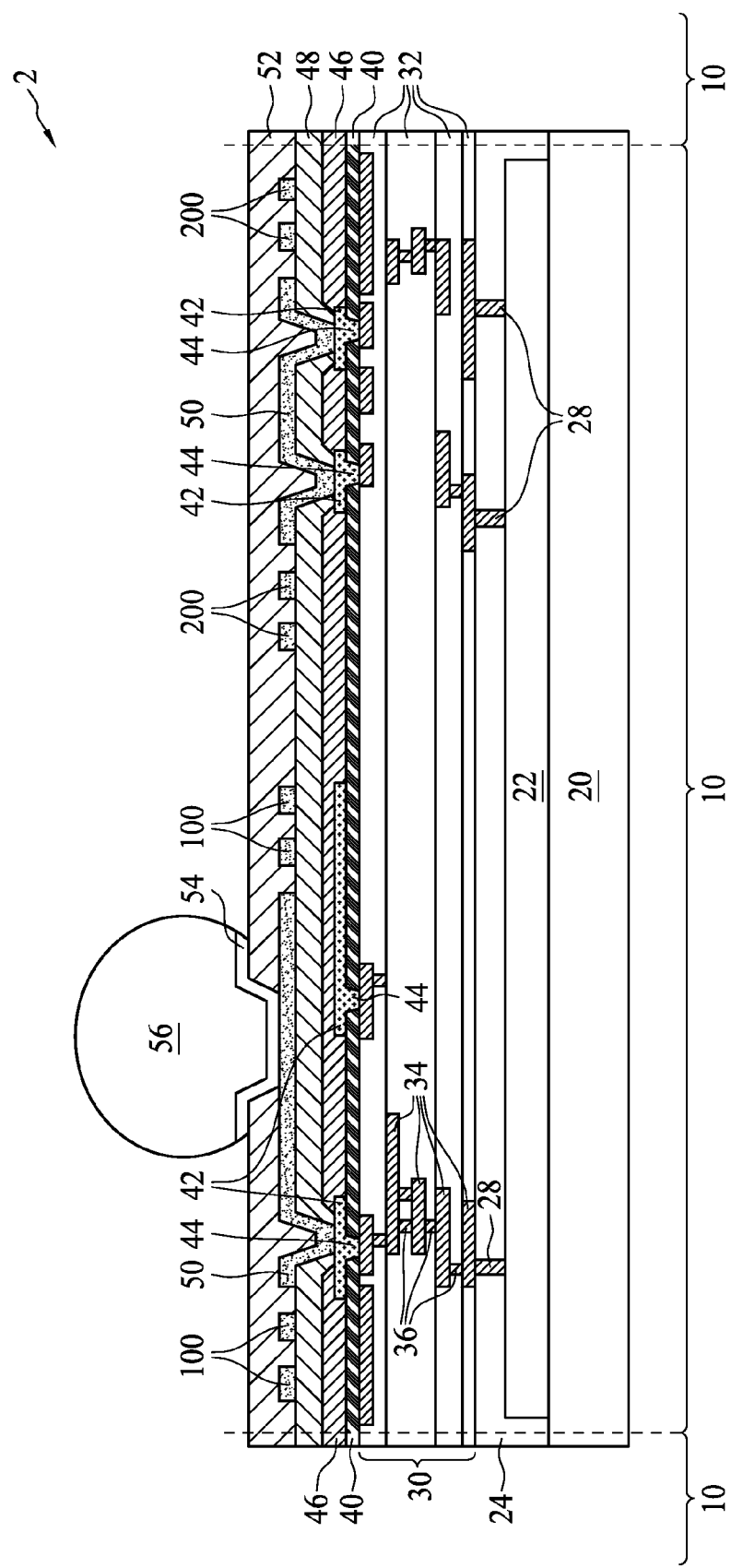
FIG. 1 illustrates a cross-sectional view of a portion of a wafer in accordance with some exemplary embodiments, wherein the wafer includes a Post-Passivation Interconnect (PPI) having a dummy metal plate in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A dummy metal in a redistribution layer of a die (or a wafer) is provided in accordance with various exemplary embodiments. Some variations of some embodiments are discussed. Throughout the various views and illustrative embodiments, like reference numbers are used to designate like elements.

FIG. 1 illustrates a cross-sectional view of package component 2. In accordance with some embodiments of the present disclosure, package component 2 is a device wafer including active devices such as transistors and/or diodes, and possibly passive devices such as capacitors, inductors, resistors, or the like. In accordance with alternative embodiments of the present disclosure, package component 2 is an interposer wafer, which may or may not include active devices and/or passive devices. In accordance with yet alternative embodiments of the present disclosure, package component 2 is a package substrate strip, which includes core-less package substrates or the package substrates with cores therein. In subsequent discussion, a device wafer is discussed as an exemplary package component 2. The teaching of the present disclosure may also be applied to interposer wafers, package substrates, etc.

In accordance with some embodiments of the present disclosure, the exemplary wafer 2 includes semiconductor substrate 20 and the features formed at a top surface of semiconductor substrate 20. Semiconductor substrate 20 may comprise crystalline silicon, crystalline germanium, silicon germanium, and/or a III-V compound semiconductor such as GaAsP, AlInAs, AlGaAs, GaInAs, GaInP, GaInAsP, and the like. Semiconductor substrate 20 may also be a bulk silicon substrate or a Silicon-On-Insulator (SOI) substrate. Shallow Trench Isolation (STI) regions (not shown) may be formed in semiconductor substrate 12 to isolate the active regions in semiconductor substrate 20. Although not shown, through-vias may be formed to extend into semiconductor substrate 20, wherein the through-vias are used to electrically inter-couple the features on opposite sides of wafer 2.

In accordance with some embodiments of the present disclosure, wafer 2 includes integrated circuit devices 22, which are formed on the top surface of semiconductor substrate 20. Exemplary integrated circuit devices 22 include Complementary Metal-Oxide Semiconductor (CMOS) transistors, resistors, capacitors, diodes, and the like. The details of integrated circuit devices 22 are not illustrated herein. In accordance with alternative embodiments, wafer 2 is used for forming interposers, wherein substrate 20 may be a semiconductor substrate or a dielectric substrate.

Inter-Layer Dielectric (ILD) 24 is formed over semiconductor substrate 20 and fills the space between the gate stacks of transistors (not shown) in integrated circuit devices 22. In accordance with some exemplary embodiments, ILD 24 comprises phosphosilicate glass (PSG), borosilicate glass (BSG), boron-doped phosphosilicate glass (BPSG), fluorine-doped silicate glass (FSG), tetraethyl orthosilicate (TEOS), or the like. ILD 24 may be formed using spin coating, Flowable Chemical Vapor Deposition (FCVD), or the like. In accordance with alternative embodiments of the present disclosure, ILD 24 is formed using a deposition method such as Plasma Enhanced Chemical Vapor Deposition (PECVD), Low Pressure Chemical Vapor Deposition (LPCVD), or the like.

Contact plugs 28 are formed in ILD 24, and are used to electrically connect integrated circuit devices 22 to overlying metal lines, and vias. In accordance with some embodiments of the present disclosure, contact plugs 28 are formed of a conductive material selected from tungsten, aluminum, copper, titanium, tantalum, titanium nitride, tantalum nitride, alloys therefore, and/or multi-layers thereof. The formation of contact plugs 28 may include forming contact openings in ILD 24, filling a conductive material(s) into the contact openings, and performing a planarization (such as Chemical Mechanical Polish (CMP)) to level the top surfaces of contact plugs 28 with the top surface of ILD 24.

Over ILD and contact plugs 28 is interconnect structure 30. Interconnect structure 30 includes metal lines 34 and vias 36, which are formed in dielectric layers 32. The combination of metal lines at a same level is referred to as a metal layer hereinafter. In accordance with some embodiments of the present disclosure, interconnect structure 30 includes a plurality of metal layers that are interconnected through vias 36. Metal lines 34 and vias 36 may be formed of copper or copper alloys, and they can also be formed of other metals. In accordance with some embodiments of the present disclosure, dielectric layers 32 are formed of low-k dielectric materials. The dielectric constants (k values) of the low-k dielectric materials may be less than about 3.0, or less than about 2.5, for example.

Dielectric layers 32 are alternatively referred to as Inter-Metal Dielectric (IMD) layer 32 hereinafter. In accordance with some embodiments of the present disclosure, IMD layers 32 are formed of a low-k dielectric material having a dielectric constant (k-value) lower than about 3.0, about 2.5, or even lower. IMD layers 32 may comprise Black Diamond (a registered trademark of Applied Materials), a carbon-containing low-k dielectric material, Hydrogen SilsesQuioxane (HSQ), MethylSilsesQuioxane (MSQ), or the like. IMD layers 32 may also have a low-k value, which may be lower than about 3.0, 2.5, or 2.0. In accordance with some embodiments of the present disclosure, the formation of IMD layers 32 includes depositing a porogen-containing dielectric material and then performing a curing process to drive out the porogen, and hence the remaining IMD layers 32 is porous.

Metal lines 34 and vias 36 are formed in IMD layers 32. The formation process may include single damascene and dual damascene processes. In an exemplary single damascene process, a trench is first formed in one of IMD layers 32, followed by filling the trench with a conductive material. A planarization such as CMP is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via respectively. The conductive material may include a diffusion barrier layer and a copper-containing metallic material over the diffusion barrier layer, wherein the barrier layer may include titanium, titanium nitride, tantalum, tantalum nitride, or the like.

Passivation layer 40 (sometimes referred to as passivation-1) may be formed over interconnect structure 30, wherein vias 44 are formed in passivation layer 40 to electrically connect metal lines 34 and vias 36 to overlying metal pads 42.

Metal pads 42 are formed over passivation layer 40, and may be electrically coupled to integrated circuit devices 22 through vias 44 in passivation layer 40, and through metal lines 34 and vias 36 in accordance with some exemplary embodiments. Metal pads 42 may be aluminum pads or aluminum-copper pads, and other metallic materials may be used.

Passivation layer 46 (sometimes referred to as passivation-2) is formed over passivation layer 40. Some portions of passivation layer 46 may cover the edge portions of metal pads 42, and central portions of metal pads 42 are exposed through openings in passivation layer 46. Each of passivation layers 40 and 46 may be a single layer or a composite layer, and may be formed of a non-porous material. In accordance with some embodiments of the present disclosure, one or both of passivation layers 40 and 46 is a composite layer comprising a silicon oxide layer (not shown), and a silicon nitride layer (not shown) over the silicon oxide layer. Passivation layers 40 and 46 may also be formed of other non-porous dielectric materials such as Un-doped Silicate Glass (USG), silicon oxynitride, and/or the like.

Polymer layer 48 is formed over passivation layer 46. Polymer layer 48 may comprise a polymer such as polyimide, PolyBenzOxazole (PBO), BenzoCycloButene (BCB), or the like. The formation methods may include spin coating, for example. Polymer layer 48 may be dispensed in a liquid form, and then cured.

Polymer layer 48 is patterned, and PPIs 50 and dummy metal plates 100 and 200 are formed, which include first portions overlying polymer layer 48, and second portions extending into polymer layer 48 to electrically couple to metal pads 42. The term "PPI" indicates that the formation of PPIs 50 is after the formation of passivation layer 46. In accordance with some embodiments of the present disclosure, the formation of PPIs 50 and dummy metal plates 100 and 200 includes depositing a seed layer (not shown), forming and patterning a mask layer (such as photo resist, not shown) over the seed layer, and then plating a metal layer over the seed layer and in the openings of the mask layer. The seed layer may include a titanium layer and a copper layer over the titanium layer, and may be deposited using Physical Vapor Deposition (PVD). The metal layer may be formed of pure copper, substantially pure copper, or a copper alloy, and may be formed using plating. After the formation of the metal layer, the mask layer is removed. An etching step is performed to remove the portions of the seed layer underlying the removed mask layer.

FIG. 1 also illustrates the formation of polymer layer 52 and Under-Bump-Metallurgies (UBMs) 54. Polymer layer 52 may comprise polyimide or other polymer-based material such as PBO or BCB. In accordance with some embodiments of the present disclosure, polymer layer 52 is formed using spin coating. Polymer layer 52 comprises some portions overlapping PPIs 50.

UBM layers 54 are formed to electrically couple to PPIs 50. In accordance with some embodiments of the present disclosure, each of UBM layers 54 includes a barrier layer and a metal layer (not shown) over the barrier layer. UBM layers 54 extend into the opening in polymer layer 52, and are electrically coupled to, and may be in physical contact with, PPIs 50. The barrier layer may be a titanium layer, a titanium nitride layer, a tantalum layer, a tantalum nitride layer, or a layer formed of a titanium alloy or a tantalum alloy.

Electrical connectors 56 are formed over UBM layers 54. In accordance with some embodiments of the present disclosure, electrical connectors 56 are metal regions, which are either solder balls placed on UBM layers 54, or non-solder metal pillars formed on UBM layers 54 through plating. In the embodiments wherein solder balls are used, the solder balls may go through a reflow process to form solder regions. In accordance with alternative embodiments, electrical connectors 56 comprise metal pillars, which may be copper pillars. Additional layers such as a nickel layer, a solder cap, a palladium layer, and/or the like, may also be formed on each of the metal pillars.

Wafer 2 will be singulated as a plurality of dies 10, wherein each of the dies 10 includes the structures including substrate 20, interconnect structure 30, metal pads 42, PPIs 50, dummy metal plates 100 and 200, and electrical connectors 56.

Figure 2:
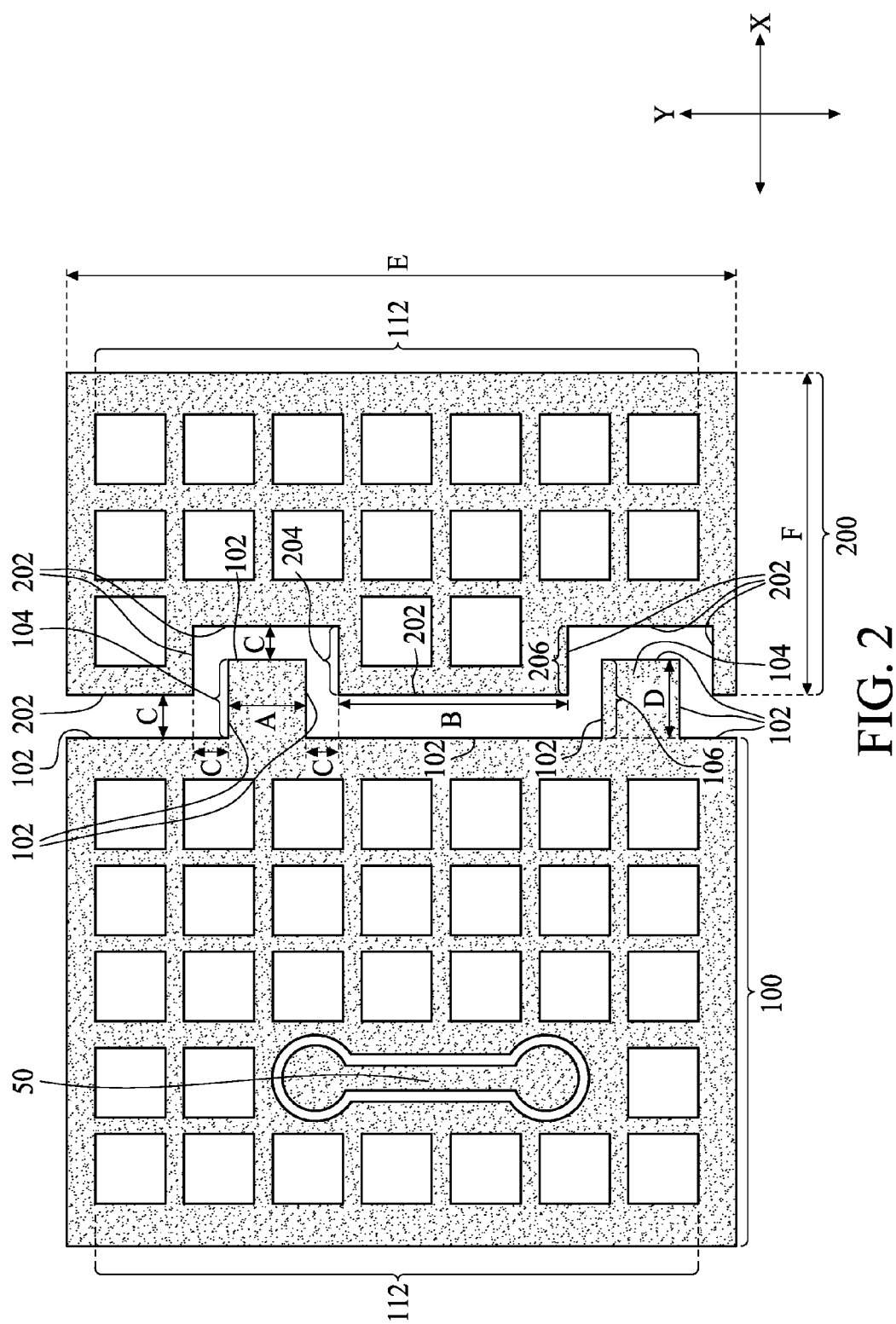
FIGS. 2 through 6 are top views of dummy metal plates in accordance with some embodiments.

FIG. 2 illustrates a top view of the dummy metal pads 100 and 200. The exemplary dummy metal plates 100 and 200 are also illustrated in FIG. 1. In accordance with some embodiments of the present disclosure, dummy metal plates 100 and 200 are formed simultaneously as the formation of PPIs 50. Accordingly, dummy metal plates 100 and 200 are formed of the same material as PPIs 50. Dummy metal plate 100 and dummy metal plate 200 are physically spaced apart from each other by spacing C, which may be greater than about 10 μm in accordance with some embodiments. Spacing C is filled with a dielectric material such as polymer layer 52 as shown in FIG. 1.

Each of dummy metal plates 100 and 200 is a continuous metal pad, with a plurality of through-openings 112 in each of dummy metal plates 100 and 200. Openings 112 may have a repeated pattern such as an array. Openings 112 are filled with a dielectric material such as polymer layer 52 as shown in FIG. 1. By forming openings 112 in dummy metal plates 100 and 200, the metal pattern density of dummy metal plates 100 and 200 is reduced, and hence in the formation of PPIs 50 as shown in FIG. 1, the pattern-loading effect caused by non-uniform metal pattern density is reduced. The top-view shape of openings 112 may be rectangles, circles, hexagons, octagons, ellipses, or the like. An exemplary PPI 50 is illustrated as encircled by dummy metal plate 100. It is noted that there may be a plurality of PPIs 50 encircled by dummy metal plate 100, and there may be one or a plurality of PPIs 50 encircled by dummy metal plate 200 also. Dummy metal plates 100 and 200 may be electrically connected to the electrical ground, or may be electrically floating. In accordance with some embodiments, dummy metal plates 100 and 200 are connected to one of electrical connectors 56 (FIG. 1) that is used for grounding through some PPIs 50.

Dummy metal plate 100 has bent (zigzagged) edge 102, and dummy metal plate 200 has bent (zigzagged) edge 202. Edges 102 and 202 face each other, and may be parallel with each other. Throughout the description, when edges 102 and 202 are referred to as parallel to each other, it indicates that the plurality of sections of edges 102 is parallel to the nearest sections of edges 202. Furthermore, the respective sections of edges 102 and 202 may be, or may not be, spaced apart from each other by uniform spacing C.

Figure 4:
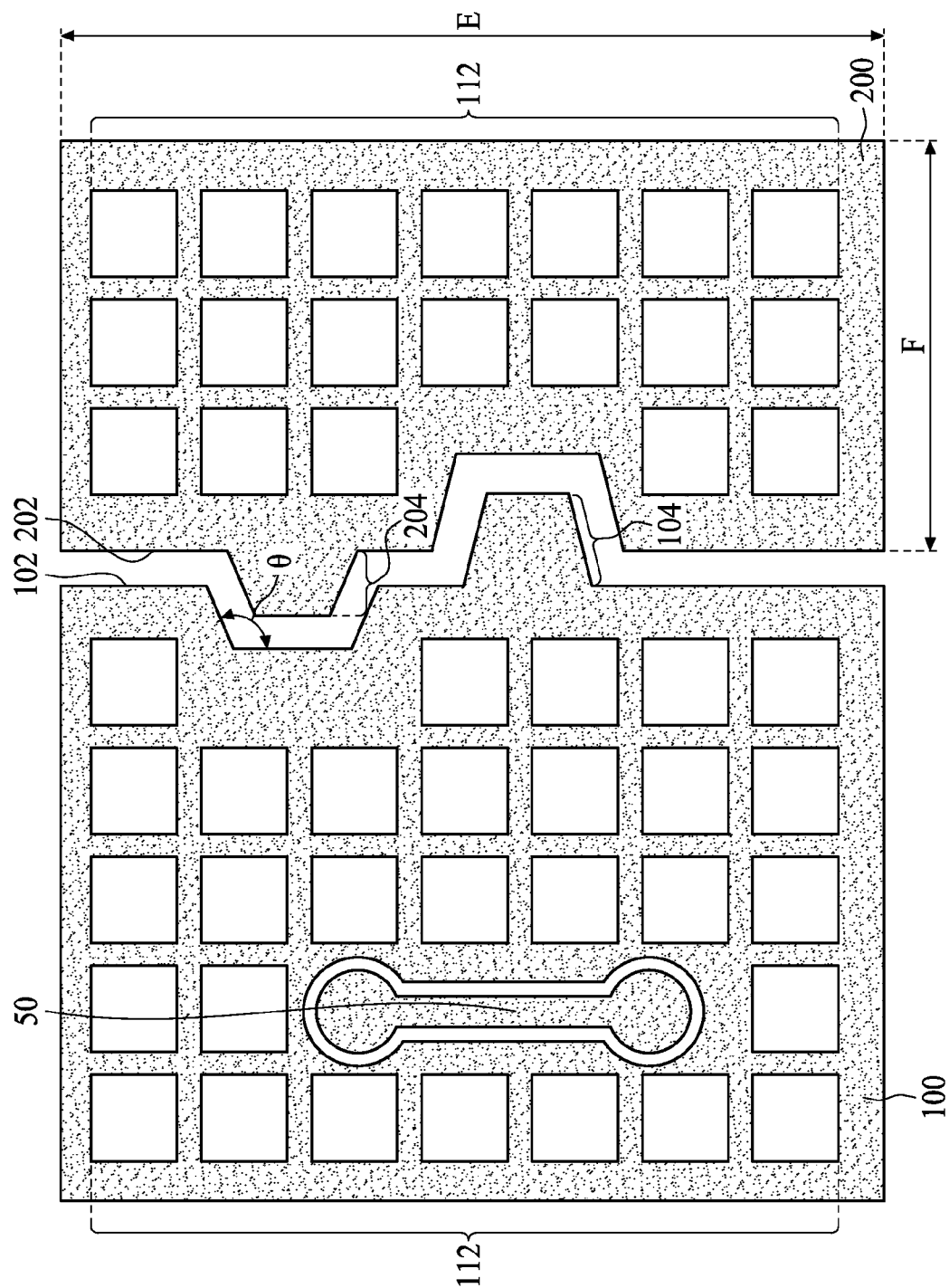
Figure 5:
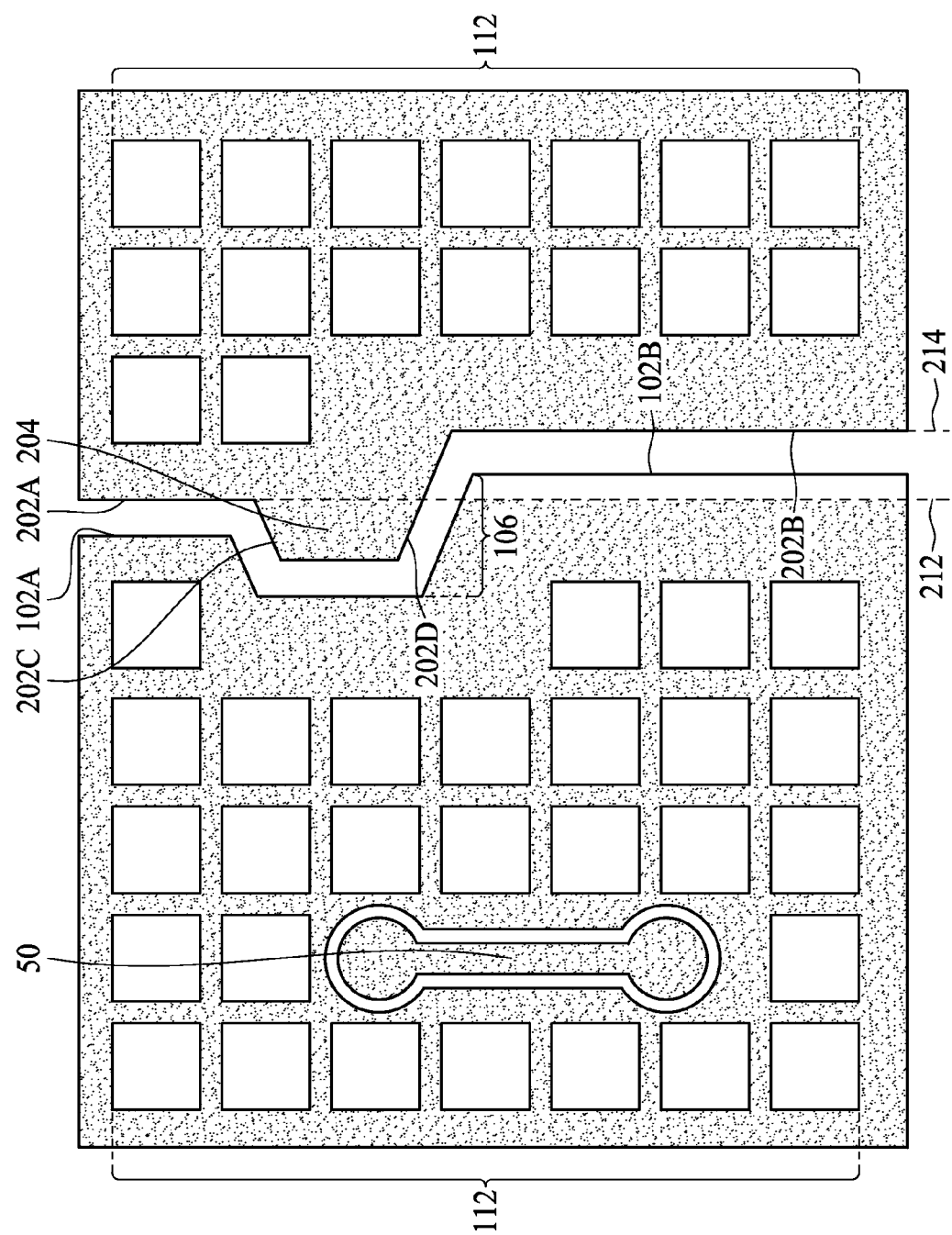
Figure 6:
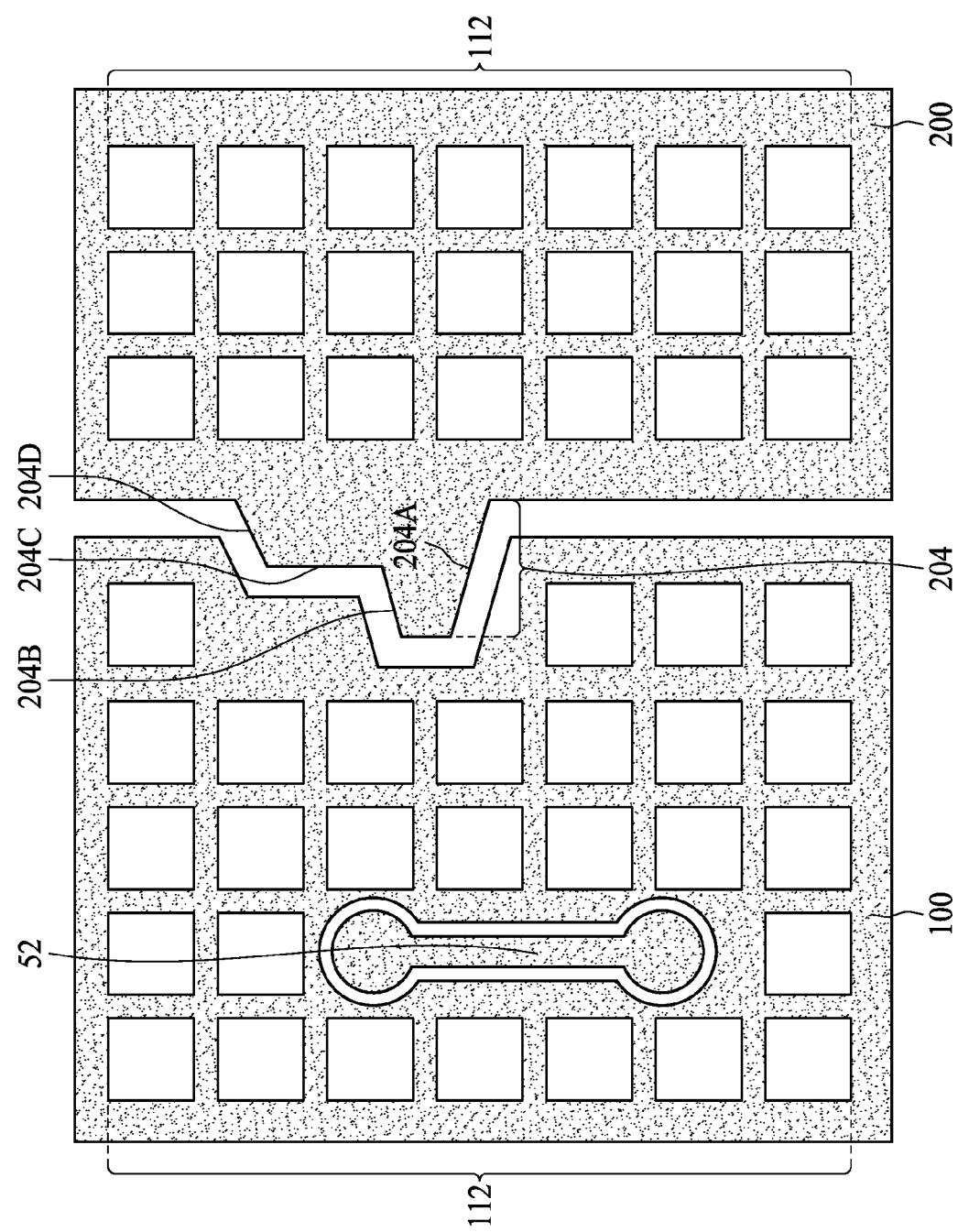

In accordance with the embodiments of the present disclosure, edge 102, instead of being a long and straight edge, is bent (zigzagged), and have neighboring sections that are short and extend in different directions (such as X-direction, Y-direction, or other directions as shown in FIGS. 4 through 6). It is appreciated that if dummy metal plates 100 and 200 have long and straight edges, during thermal cycles, since an entire long edge contracts or expands in the same direction, which is perpendicular to the lengthwise direction of the respective edge, the accumulated contracting or expanding force may cause crack to be formed along the interface between the edge and the contacting dielectric material. On the other hand, when the long and straight edges are redesigned as having short sections that extend in different directions, since the contracting or expanding force of each of the sections is perpendicular to the lengthwise direction of the respective section, the forces are much smaller and are in different directions. The stress vector at the interface of metal dummy plates and the dielectric material is thus discontinued, and the likelihood of generating cracks is reduced.

Referring back to FIG. 2, the edge sections, regardless of their extending directions, are designed to have lengths smaller than a threshold length. In accordance with some exemplary embodiments, the threshold length is about 400 μm. Experiment results indicated that a large metal pad with all of its edge sections being smaller than about 400 μm will not have the cracks generated along their edges during thermal cycles, while if the large metal pads have long edges are formed, cracks were observed.

FIG. 2 illustrates dummy metal plate 100 has protruding portions 104, and length A and width D of protruding portions 104 are smaller than the threshold length such as 400 μm. Furthermore, dummy metal plate 100 has recesses 106, and the respective sections of edge 102 are recessed with relative to its neighboring edge sections. The length and width of recesses 106 are also smaller than the threshold length. Similarly, edge 202 of dummy metal plate 200 also includes a plurality of edge sections, with neighboring edge sections extending in different directions. Furthermore, the lengths of the edge sections of edge 202 are also smaller than the threshold length.

The bent edges 102 and 202 may form zigzag patterns. FIG. 2 illustrates a small portion of dummy metal plates 100 and 200, and the zigzag pattern may repeat. The number of repeating is determined by the overall length of edges 102 and 202, and may be any number greater than 1. For example, the edge portions including a protruding portion 104 and a recess 106 may form a base unit that is repeated. Protruding portions 104 and recesses 106 may be laid out in an alternating pattern. Furthermore, protruding portions 104 in the repeated patterns may have the same length and/or the same width, and recesses 106 may have the same length and/or the same width.

Dummy metal plate 200 may have a portion 204 protruding toward recess 106. Protruding portion 204 may also have a portion extending into recess 106. Similarly, dummy metal plate 100 may have protruding portion protruding toward, and possibly extending into, recess 206 of dummy metal plate 200.

Figure 9:
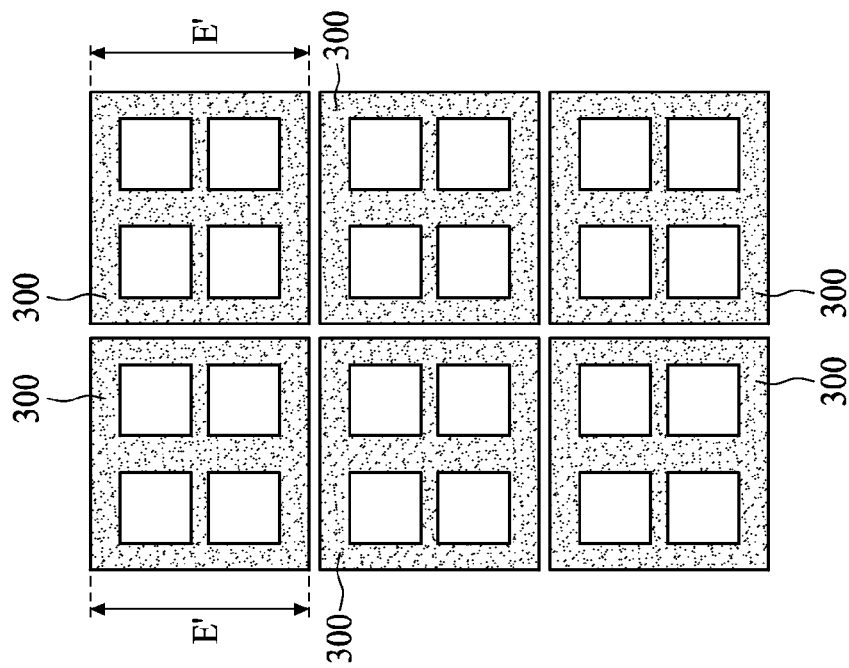
FIG. 9 illustrate a top view of large dummy metal plates with zigzagged edges and small dummy metal plates with smooth edges.
Figure 9:
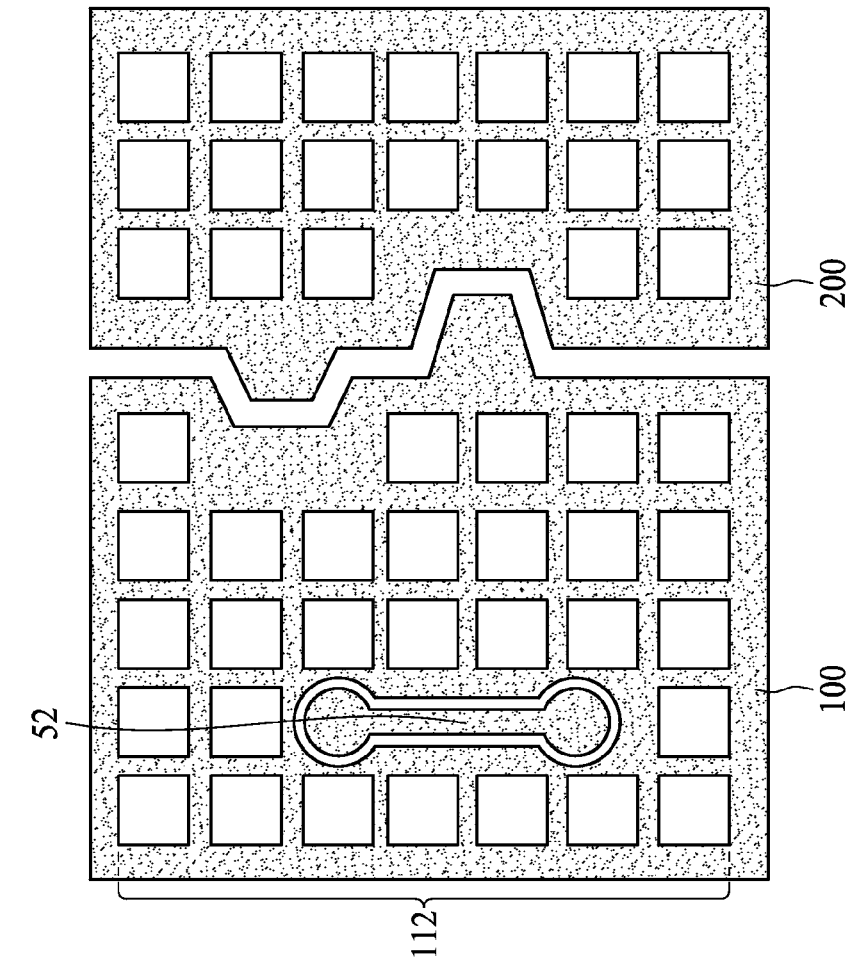

In accordance with some embodiments of the present disclosure, the zigzagged edges are adopted when the respective edges of a dummy metal pad are long, for example, when lengths E or F is longer than 400 μm, in which case, the stress vector is high enough to crack the dielectric (polymers 48 and/or 52 in FIG. 1). If the respective edge is already short, then the edge may be left being straight without being bent. For example, FIG. 9 illustrates dummy metal plates 300 with length E' smaller than length E, wherein length E' is smaller than the threshold length, which may be smaller than about 400 μm. Accordingly, the edges of dummy metal plates 300 are left as straight, and are not bent (zigzagged).

In accordance with some embodiments of the present disclosure, throughout the entire wafer 2 and the entire die 10 (FIG. 1), all straight edges of dummy metal plates that are longer than the threshold length are bent, so that the straight sections of the bent edges throughout wafer 2 (and die 10) are equal to or smaller than the threshold length. Alternative stated, no dummy metal plate in wafer 2 has straight edge that is longer than the threshold length. To achieve such as design, an integrated circuit design process in accordance with the embodiments of the present disclosure may include designing the initial pattern of dummy metal plates, predetermining a threshold length, searching for any edge of dummy metal plates that is longer than the threshold length, and modify the design to bend the edge into straight and short sections, with none of the straight sections having length greater than the threshold length. During the modification of the design, the edges of the dummy metal plates that are equal to or shorter than the threshold length may be kept unmodified.

Figure 3:
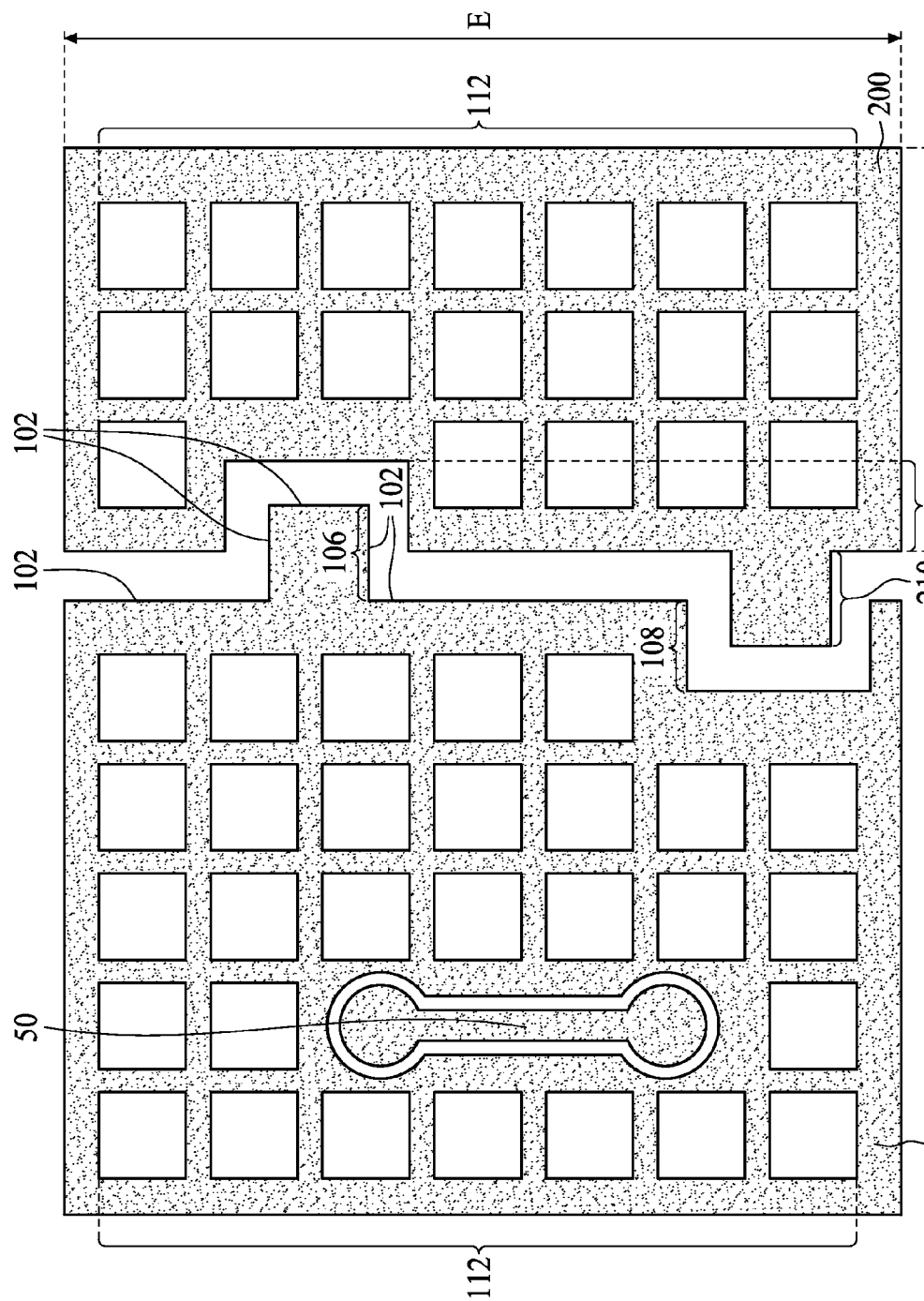

FIGS. 3 through 6 illustrate the top views of dummy metal plates 100 and 200 in accordance with some embodiments of the present disclosure, wherein the discussion of the dummy metal pads 100 and 200 in FIG. 2, whenever applicable, also applies to the embodiments in FIGS. 3 through 6. It is noted that each of FIGS. 3 through 6 illustrate small portions of dummy metal plates 100 and 200, and the illustrated patterns of edge sections may be repeated to have zigzag patterns. Referring to FIG. 3, in accordance with some embodiments of the present disclosure, recess 108 of dummy metal plate 100 is further recessed from recess 106. Accordingly, protruding portion 210 of dummy metal plate 200 may further protrude beyond protruding portion 204. In these embodiments, when recesses 106 and 108 are in combination considered as a composite recess, the illustrated edge 102 has a protruding portion and a recess next to the protruding portion. The protruding portion and the recess may be repeated, and hence the edge 102 of dummy metal plate 100 also has a zigzag pattern. Similarly, edge 202 of dummy metal plate 200 also has a zigzag pattern. Furthermore, the protruding portions of dummy metal plate 100 may extend toward, and possibly into, the recess of dummy metal plate 200, and vice versa.

In the exemplary embodiments as shown in FIGS. 2 and 3, the neighboring sections of edges 102 and 202 are perpendicular to each other to form right angles. FIGS. 4, 5, and 6 illustrate some exemplary embodiments in which the outer angles (the angles measured outside of dummy metal plates 100 and 200) are obtuse angles, which are greater than 90 degrees. As a result, the protruding portions 104 and 204 may have trapezoid shapes. Experiment results indicate that acute angles are more likely to cause cracking in dummy metal plates, and acute angles and right angles result in more reliable dielectric layer and dummy metal plate that do not crack. In accordance with some exemplary embodiments, outer angle θ is about 135 degrees.

FIG. 5 illustrates an exemplary embodiment wherein the edge sections on opposite sides of a protruding portion of a dummy metal plate are not aligned to a straight line. For example, edge sections 202A and 202B are aligned to straight lines 212 and 214, respectively, which do not overlap. Accordingly, edges 202C and 202D of protruding portion 204 have different lengths. Correspondingly, the edge sections 102A and 102B, which are on the opposite sides of recess 106, are not aligned to a straight line.

FIG. 6 illustrates yet other dummy metal plates 100 and 200 in accordance with some embodiments, wherein the edges on opposite sides of protruding portion 204 have different number of sections. For example, a single section 204A forms one edge of protruding portion 204, while sections 204B, 204C, and 204D in combination form the opposite edge of protruding portion 204.

Figure 7:
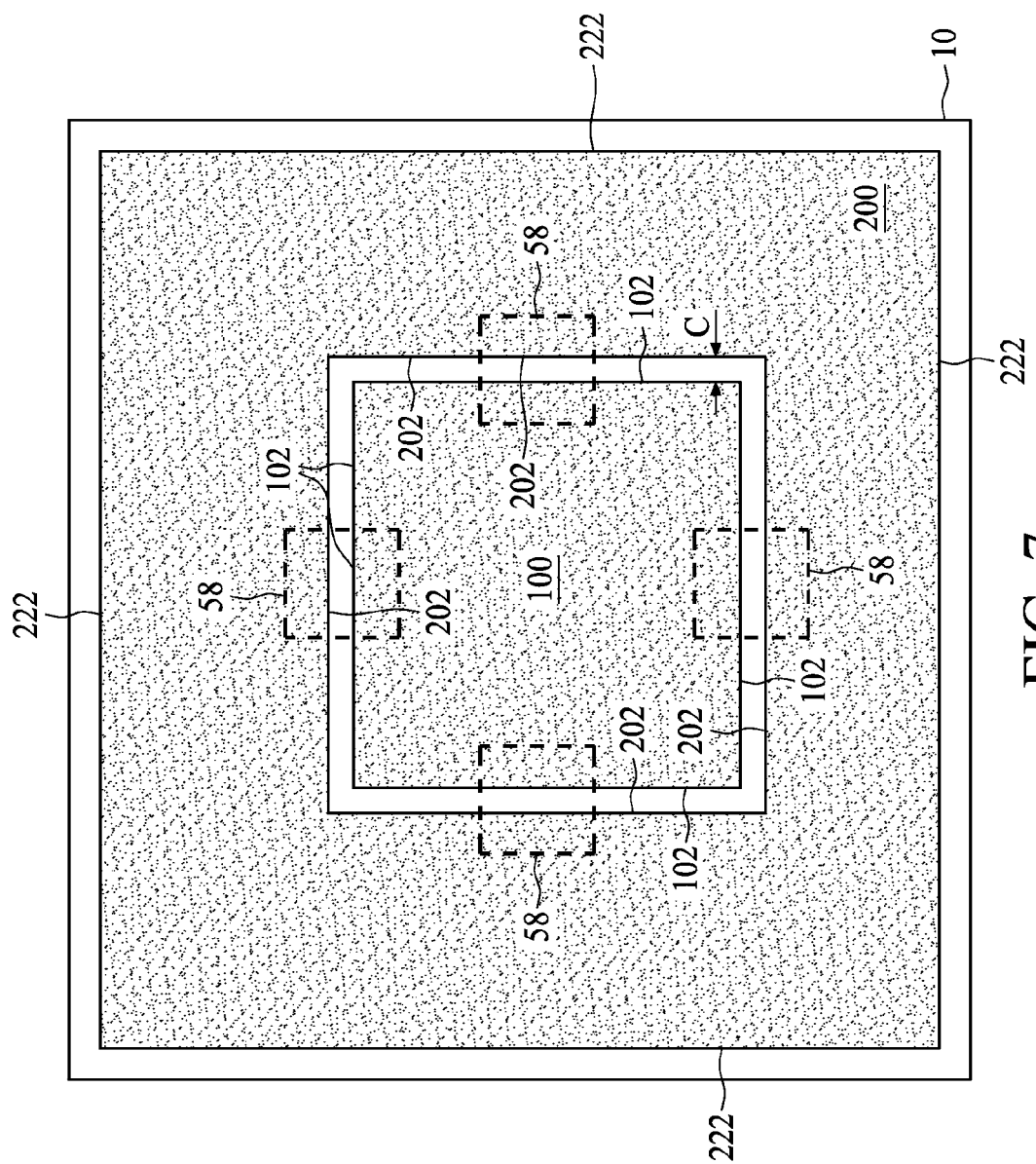
FIGS. 7 and 8 illustrate the top views of dummy metal plates in a whole chip in accordance with some embodiments.

FIG. 7 illustrates dummy metal plates 100 and 200 in die 10 in accordance with some exemplary embodiments. Dummy metal plate 200 may fully encircle dummy metal plate 100, with spacing C separating dummy metal plates 100 and 200 from each other. Dashed rectangles 58 are drawn to represent some regions of die 10, wherein the magnified views of regions 58 may be represented by FIGS. 2 through 6 in any combination. The openings 112 and PPIs 50 (FIGS. 2 through 6) are not illustrated in FIG. 7, although they still exist in dummy metal plates 100 and/or 200 in FIG. 7. In these embodiments, dummy metal plate 100 includes four edges 102, which, when magnified as shown in FIGS. 2 through 6, are bent and have zigzag patterns. Furthermore, dummy metal plate 200 includes four edges 202, which, when magnified, are also zigzagged as shown in FIGS. 2 through 6. Dummy metal plate 200 may also include four edges 222 proximal the edges of die 10. Edges 222, when magnified, are also zigzagged as shown in FIGS. 2 through 6.

Figure 8:
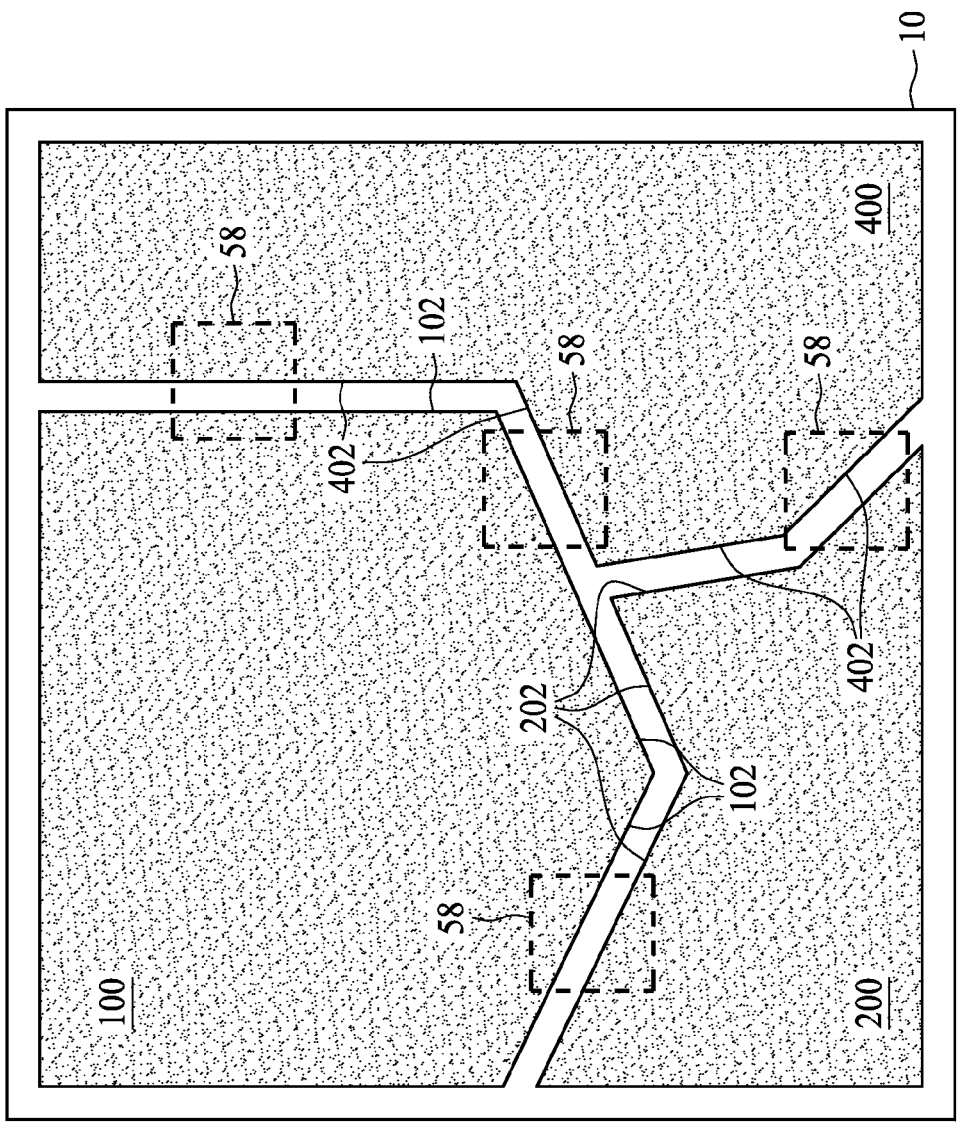

FIG. 8 illustrates dummy metal plates 100, 200, and 400 in die 10 in accordance with some exemplary embodiments. Dummy metal plates 100, 200, and 400 have irregular top-view shapes in accordance with some embodiments. Dummy metal plates 100, 200, and 400 are spaced apart from each other by a dielectric material. Dashed regions 58 are drawn, wherein the magnified views of regions 58 may be represented by FIGS. 2 through 6 in any combinations. The openings 112 and PPIs 50 (FIGS. 2 through 6) are not illustrated, although they still exist in dummy metal plates 100 and/or 200 in FIG. 8. In these embodiments, edges 102 of dummy metal plate 100, edges 202 of dummy metal plate 200, and edges 402 of dummy metal plate 400, when magnified as shown in FIGS. 2 through 6, are also bent/zigzagged.

Referring back to FIG. 1, one PPI layer that includes PPIs 50 and dummy metal plates 100 and 200 is shown in accordance with some embodiments. In accordance with alternative embodiments, there may be two, three, or more PPI layers over the illustrated PPI layer. In the overlying PPI layers, there may be dummy metal plates similar to dummy metal plates 100, 200, 300, and 400 as illustrated in FIGS. 2 through 8. The patterns and the edge design of the dummy metal plates in the overlying PPI layers are essentially the same as presented in the embodiments of the present disclosure, and hence are not repeated.

The embodiments of the present disclosure have some advantageous features. By replacing the long straight edges of the dummy metal plates with short straight edges extending in different directions, the stress on the otherwise long straight edges is discontinued, and cracks are less likely to occur.

In accordance with some embodiments of the present disclosure, a structure includes a metal pad, a passivation layer having a portion covering edge portions of the metal pad, and a dummy metal plate over the passivation layer. The dummy metal plate has a plurality of through-openings therein. The dummy metal plate has a zigzagged edge. A dielectric layer has a first portion overlying the dummy metal plate, second portions filling the first plurality of through-openings, and a third portion contacting the first zigzagged edge.

In accordance with some embodiments of the present disclosure, a structure includes a first dummy metal plate having a first plurality of protrusions and a first plurality of recesses located alternatively. The structure further includes a second dummy metal plate having a second plurality of protrusions and a second plurality of recesses located alternatively. A polymer strip separates the first dummy metal plate from the second dummy metal plate, wherein opposite edges of the polymer strip are in contact with the first dummy metal plate from the second dummy metal plate.

In accordance with some embodiments of the present disclosure, a die includes a first dummy metal plate having a first plurality of protrusions and a first plurality of recesses located in a first alternating layout, and a second dummy metal plate fully encircling the first dummy metal plate. The second dummy metal plate has a second plurality of protrusions and a second plurality of recesses located in a second alternating layout. The first plurality of protrusions extends into corresponding ones of the second plurality of recesses, and the second plurality of protrusions extends into corresponding ones of the first plurality of recesses. A dielectric layer separates the first dummy metal plate from the second dummy metal plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a metal pad;
    a passivation layer having a portion covering edge portions of the metal pad;
    a first dummy metal plate over the passivation layer, wherein the first dummy metal plate has a first plurality of through-openings therein, and the first dummy metal plate comprises a first zigzagged edge; and
    a dielectric layer comprising:
        a first portion overlying the first dummy metal plate;
        second portions filling the first plurality of through-openings; and
        a third portion contacting the first zigzagged edge.

2. The structure of claim 1, wherein the first zigzagged edge comprises a plurality of edge portions, with neighboring ones of the plurality of edge portions extending in different directions, and wherein none of the edge portions of the first zigzagged edge has a length greater than about 400 μm.

3. The structure of claim 1, wherein the first dummy metal plate comprises first protrusions and first recesses, with the first zigzagged edge comprising edges of the first protrusions and the first recesses, and the first protrusions and the first recesses are allocated in an alternating pattern.

4. The structure of claim 3, wherein the first protrusions have a first same width and a first same length as each other, and the first recesses have a second same width and a second same length as each other.

5. The structure of claim 3, wherein the first protrusions have trapezoid top-view shapes.

6. The structure of claim 3 further comprising a second dummy metal plate over the passivation layer, wherein the second dummy metal plate comprises a second zigzagged edge with second protrusions and second recesses, and the first protrusions extend into corresponding ones of the second recesses, and the second protrusions extend into corresponding ones of the first recesses.

7. The structure of claim 1 further comprising a second dummy metal plate over the passivation layer, wherein the second dummy metal plate has a second plurality of through-openings therein, and the second dummy metal plate comprises a second zigzagged edge with a plurality of sections, with the first zigzagged edge and the second zigzagged edge having a substantially uniform spacing therebetween.

8. The structure of claim 7, wherein the first zigzagged edge comprises an additional plurality of sections, wherein the additional plurality of sections is parallel to respective ones of the plurality of sections of the second zigzagged edge.

9. The structure of claim 1 further comprising a redistribution line fully encircled by the first dummy metal plate.

10. A structure comprising:
    a first dummy metal plate comprising:
        a first plurality of protrusions and a first plurality of recesses located alternatively;
    a second dummy metal plate comprising:
        a second plurality of protrusions and a second plurality of recesses located alternatively; and
    a polymer strip separating the first dummy metal plate from the second dummy metal plate, wherein opposite edges of the polymer strip are in contact with the first dummy metal plate from the second dummy metal plate.

11. The structure of claim 10, wherein the first plurality of protrusions has lengths equal to each other, and the first plurality of recesses have widths equal to each other.

12. The structure of claim 10, wherein the first dummy metal plate comprises a first edge having a first plurality of edge sections, and the second dummy metal plate comprises a second edge having a second plurality of edge sections, and each of the first plurality of edge sections is parallel to a corresponding nearest one of the second plurality of edge sections.

13. The structure of claim 10, wherein the first dummy metal plate fully encircles the second dummy metal plate.

14. The structure of claim 10, wherein each of the first plurality of protrusions extends into a corresponding one of the second plurality of recesses, and each of the second plurality of protrusions extends into a corresponding one of the first plurality of recesses.

15. The structure of claim 10, wherein the first plurality of protrusions and the first plurality of recesses have trapezoid top-view shapes.

16. The structure of claim 10, wherein the first plurality of protrusions and the first plurality of recesses have rectangular top-view shapes.

17. A structure comprising:
    a die comprising:
        a first dummy metal plate comprising a first plurality of protrusions and a first plurality of recesses located in a first alternating layout;
        a second dummy metal plate fully encircling the first dummy metal plate, wherein the second dummy metal plate comprises a second plurality of protrusions and a second plurality of recesses located in a second alternating layout, wherein the first plurality of protrusions extends into corresponding ones of the second plurality of recesses, and the second plurality of protrusions extends into corresponding ones of the first plurality of recesses; and
        a dielectric layer separating the first dummy metal plate from the second dummy metal plate.

18. The structure of claim 17, wherein the second dummy metal plate comprises outer edges proximal to respective edges of the die.

19. The structure of claim 18, wherein the outer edges of the second dummy metal plate are zigzagged.

20. The structure of claim 17, wherein the first dummy metal plate and the second dummy metal plate are electrically grounded.

* * * * *